(12) United States Patent
Sewell et al.

(10) Patent No.: US 8,817,226 B2
(45) Date of Patent: Aug. 26, 2014

(54) SYSTEMS AND METHODS FOR INSITU LENS CLEANING USING OZONE IN IMMERSION LITHOGRAPHY

(75) Inventors: Harry Sewell, Ridgefield, CT (US); Louis John Markoya, Sandy Hook, CT (US)

(73) Assignee: ASML Holding N.V., Veldhoven (NL)

( * ) Notice: Subject to any disclaimer, the term of this patent is extended or adjusted under 35 U.S.C. 154(b) by 280 days.

(21) Appl. No.: 12/128,035

(22) Filed: May 28, 2008

(65) Prior Publication Data

US 2009/0109411 A1    Apr. 30, 2009

Related U.S. Application Data

(63) Continuation-in-part of application No. 11/706,434, filed on Feb. 15, 2007.

(30) Foreign Application Priority Data

Feb. 8, 2008 (JP) .................................. 2008-28305

(51) Int. Cl.
| | | |
|---|---|---|
| *G03B 27/52* | (2006.01) | |
| *G03B 27/54* | (2006.01) | |
| *G03B 27/32* | (2006.01) | |
| *G03B 27/58* | (2006.01) | |
| *G03B 27/42* | (2006.01) | |

(52) U.S. Cl.
USPC ................... 355/30; 355/53; 355/67; 355/72; 355/77

(58) Field of Classification Search
USPC ............ 355/30, 52, 53, 55, 77, 67–75; 430/8, 430/30, 311; 250/492.1, 492.2, 492.22, 548
See application file for complete search history.

(56) References Cited

U.S. PATENT DOCUMENTS

| 3,573,975 A | 4/1971 | Dhaka et al. |
| 3,648,587 A | 3/1972 | Stevens |

(Continued)

FOREIGN PATENT DOCUMENTS

| DE | 221 563 | 4/1985 |
| EP | 0023231 | 2/1981 |

(Continued)

OTHER PUBLICATIONS

English translation of JP 2005-277363, published Oct. 6, 2005.*

(Continued)

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

An immersion lithography apparatus is provided that includes an energy source, a projection optical system, a stage, a showerhead including an immersion liquid supply device and an immersion liquid discharge device that produces a flow of liquid within an exposure zone, and a cleaning device that cleans a portion of the projection optical system having been contacted with the immersion liquid by means of a cleaning gas. In an embodiment, the cleaning device includes an ozone generation unit produces a flow of ozone into the exposure zone. In embodiments, the apparatus includes a stage that includes a dose sensor and/or an ultraviolet light source. A method for insitu cleaning of a final lens element within an immersion lithography system having an immersion fluid showerhead that provides immersion fluid to an exposure zone of the immersion lithography system is also provided.

7 Claims, 5 Drawing Sheets

(56) References Cited

U.S. PATENT DOCUMENTS

| | | | |
|---|---|---|---|
| 4,346,164 A | 8/1982 | Tabarelli et al. | |
| 4,390,273 A | 6/1983 | Loebach et al. | |
| 4,396,705 A | 8/1983 | Akeyama et al. | |
| 4,468,120 A | 8/1984 | Tanimoto et al. | |
| 4,480,910 A | 11/1984 | Takanashi et al. | |
| 4,509,852 A | 4/1985 | Tabarelli et al. | |
| 5,040,020 A | 8/1991 | Rauschenbach et al. | |
| 5,121,256 A | 6/1992 | Corle et al. | |
| 5,257,128 A | 10/1993 | Diller et al. | |
| 5,559,584 A * | 9/1996 | Miyaji et al. | 355/73 |
| 5,587,794 A | 12/1996 | Mizutani et al. | |
| 5,602,683 A * | 2/1997 | Straaijer et al. | 359/811 |
| 5,610,683 A | 3/1997 | Takahashi | |
| 5,715,039 A | 2/1998 | Fukuda et al. | |
| 5,825,043 A | 10/1998 | Suwa | |
| 5,900,354 A | 5/1999 | Batchelder | |
| 5,973,764 A * | 10/1999 | McCullough et al. | 355/30 |
| 6,038,015 A * | 3/2000 | Kawata | 355/67 |
| 6,191,429 B1 | 2/2001 | Suwa | |
| 6,236,634 B1 | 5/2001 | Lee et al. | |
| 6,252,648 B1 * | 6/2001 | Hase et al. | 355/53 |
| 6,268,904 B1 * | 7/2001 | Mori et al. | 355/53 |
| 6,301,055 B1 | 10/2001 | Legrand et al. | |
| 6,466,365 B1 | 10/2002 | Maier et al. | |
| 6,496,257 B1 | 12/2002 | Taniguchi et al. | |
| 6,560,032 B2 | 5/2003 | Hatano | |
| 6,600,547 B2 | 7/2003 | Watson et al. | |
| 6,603,130 B1 | 8/2003 | Bisschops et al. | |
| 6,633,365 B2 | 10/2003 | Suenaga | |
| 6,781,670 B2 | 8/2004 | Krautschik | |
| 6,788,477 B2 | 9/2004 | Lin | |
| 7,050,146 B2 | 5/2006 | Duineveld et al. | |
| 7,061,575 B2 | 6/2006 | Taniguchi et al. | |
| 7,061,578 B2 | 6/2006 | Levinson | |
| 7,091,502 B2 | 8/2006 | Gau et al. | |
| 7,145,641 B2 | 12/2006 | Kroon et al. | |
| 7,224,427 B2 | 5/2007 | Chang et al. | |
| 7,224,434 B2 | 5/2007 | Tokita | |
| 7,262,422 B2 * | 8/2007 | Subramanian et al. | 250/492.2 |
| 7,307,263 B2 | 12/2007 | Bakker et al. | |
| 7,315,033 B1 | 1/2008 | Pawloski et al. | |
| 7,385,670 B2 | 6/2008 | Compen et al. | |
| 7,388,649 B2 | 6/2008 | Kobayashi et al. | |
| 7,405,417 B2 | 7/2008 | Stevens et al. | |
| 7,462,850 B2 | 12/2008 | Banine et al. | |
| 7,880,860 B2 | 2/2011 | Jansen et al. | |
| 8,076,655 B2 | 12/2011 | Derra et al. | |
| 2001/0026354 A1 * | 10/2001 | Aoki | 355/30 |
| 2001/0026402 A1 * | 10/2001 | Gerhard et al. | 359/731 |
| 2002/0020821 A1 | 2/2002 | Van Santen et al. | |
| 2002/0163629 A1 | 11/2002 | Switkes et al. | |
| 2003/0030916 A1 | 2/2003 | Suenaga | |
| 2003/0123040 A1 | 7/2003 | Almogy | |
| 2003/0157538 A1 | 8/2003 | Krull et al. | |
| 2003/0174408 A1 | 9/2003 | Rostalski et al. | |
| 2004/0000627 A1 | 1/2004 | Schuster | |
| 2004/0017551 A1 * | 1/2004 | Arakawa | 355/30 |
| 2004/0021844 A1 | 2/2004 | Suenaga | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik et al. | |
| 2004/0135099 A1 | 7/2004 | Simon et al. | |
| 2004/0136494 A1 | 7/2004 | Lof et al. | |
| 2004/0160582 A1 | 8/2004 | De Smit et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 * | 10/2004 | Derksen et al. | 250/492.1 |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0239954 A1 | 12/2004 | Bischoff | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0007569 A1 | 1/2005 | Streefkerk et al. | |
| 2005/0018155 A1 | 1/2005 | Cox et al. | |
| 2005/0024609 A1 | 2/2005 | De Smit et al. | |
| 2005/0030497 A1 | 2/2005 | Nakamura | |
| 2005/0030506 A1 | 2/2005 | Schuster | |
| 2005/0036121 A1 * | 2/2005 | Hoogendam et al. | 355/30 |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0041225 A1 | 2/2005 | Sengers et al. | |
| 2005/0042554 A1 | 2/2005 | Dierichs et al. | |
| 2005/0046813 A1 | 3/2005 | Streefkerk et al. | |
| 2005/0046934 A1 | 3/2005 | Ho et al. | |
| 2005/0048223 A1 | 3/2005 | Pawloski et al. | |
| 2005/0052632 A1 | 3/2005 | Miyajima | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094115 A1 * | 5/2005 | Taniguchi et al. | 355/30 |
| 2005/0094116 A1 | 5/2005 | Flagello et al. | |
| 2005/0094125 A1 | 5/2005 | Arai | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0122505 A1 | 6/2005 | Miyajima | |
| 2005/0132914 A1 | 6/2005 | Mulkens et al. | |
| 2005/0134815 A1 | 6/2005 | Van Santen et al. | |
| 2005/0134817 A1 | 6/2005 | Nakamura | |
| 2005/0140948 A1 | 6/2005 | Tokita | |
| 2005/0141098 A1 | 6/2005 | Schuster | |
| 2005/0145803 A1 | 7/2005 | Hakey et al. | |
| 2005/0146693 A1 | 7/2005 | Ohsaki | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0151942 A1 | 7/2005 | Kawashima | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175776 A1 | 8/2005 | Streefkerk et al. | |
| 2005/0175940 A1 | 8/2005 | Dierichs | |
| 2005/0185155 A1 * | 8/2005 | Kishikawa | 355/30 |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0200815 A1 | 9/2005 | Akamatsu | |
| 2005/0205108 A1 * | 9/2005 | Chang et al. | 134/1 |
| 2005/0213061 A1 | 9/2005 | Hakey et al. | |
| 2005/0213065 A1 | 9/2005 | Kitaoka | |
| 2005/0213066 A1 | 9/2005 | Sumiyoshi | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219489 A1 | 10/2005 | Nei et al. | |
| 2005/0219499 A1 | 10/2005 | Maria Zaal et al. | |
| 2005/0225737 A1 | 10/2005 | Weissenrieder et al. | |
| 2005/0231694 A1 | 10/2005 | Kolesnychenko et al. | |
| 2005/0233081 A1 | 10/2005 | Tokita | |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |

(56) References Cited

U.S. PATENT DOCUMENTS

| | | |
|---|---|---|
| 2005/0259233 A1 | 11/2005 | Streefkerk et al. |
| 2005/0264774 A1 | 12/2005 | Mizutani et al. |
| 2005/0264778 A1 | 12/2005 | Lof et al. |
| 2005/0270505 A1 | 12/2005 | Smith |
| 2005/0274898 A1 | 12/2005 | Watanabe et al. |
| 2005/0286032 A1 | 12/2005 | Lof et al. |
| 2006/0023185 A1* | 2/2006 | Hazelton et al. ............... 355/53 |
| 2006/0028628 A1 | 2/2006 | Lin et al. ........................ 355/30 |
| 2006/0050351 A1 | 3/2006 | Higashiki ..................... 359/228 |
| 2006/0055900 A1* | 3/2006 | Van Der Net et al. .......... 355/30 |
| 2006/0077367 A1* | 4/2006 | Kobayashi et al. ............. 355/53 |
| 2006/0103813 A1 | 5/2006 | Niwa et al. |
| 2006/0103818 A1 | 5/2006 | Holmes et al. |
| 2006/0126043 A1 | 6/2006 | Mizutani et al. |
| 2006/0132731 A1 | 6/2006 | Jansen et al. |
| 2006/0209278 A1 | 9/2006 | Kiuchi et al. |
| 2006/0232757 A1 | 10/2006 | Tani et al. |
| 2006/0250588 A1 | 11/2006 | Brandl |
| 2006/0256316 A1 | 11/2006 | Tanno et al. |
| 2007/0002296 A1 | 1/2007 | Chang et al. |
| 2007/0026345 A1 | 2/2007 | Subramanian et al. |
| 2007/0039637 A1* | 2/2007 | Higashiki et al. ......... 134/115 R |
| 2007/0064215 A1 | 3/2007 | Dirksen et al. |
| 2007/0076197 A1 | 4/2007 | Koga |
| 2007/0085989 A1 | 4/2007 | Nagahashi et al. |
| 2007/0091287 A1 | 4/2007 | Chang et al. |
| 2007/0127001 A1 | 6/2007 | Van Der Hoeven |
| 2007/0146657 A1 | 6/2007 | Van Mierlo et al. |
| 2007/0146658 A1 | 6/2007 | Van Mierlo et al. |
| 2007/0159610 A1 | 7/2007 | Shiraishi |
| 2007/0171390 A1 | 7/2007 | Hazelton et al. |
| 2007/0172234 A1 | 7/2007 | Shigemori et al. |
| 2007/0206279 A1 | 9/2007 | Brueck et al. |
| 2007/0229789 A1 | 10/2007 | Kawamura |
| 2007/0247600 A1 | 10/2007 | Kobayashi et al. |
| 2007/0251543 A1 | 11/2007 | Singh |
| 2007/0253710 A1 | 11/2007 | Kaneyama et al. |
| 2007/0258072 A1 | 11/2007 | Nagasaka et al. |
| 2007/0274711 A1 | 11/2007 | Kaneyama et al. |
| 2007/0285631 A1 | 12/2007 | Stavenga et al. |
| 2008/0002162 A1 | 1/2008 | Jansen et al. |
| 2008/0049201 A1 | 2/2008 | Stavenga et al. |
| 2008/0218712 A1 | 9/2008 | Compen et al. |
| 2008/0273181 A1 | 11/2008 | De Jong et al. |
| 2008/0284990 A1 | 11/2008 | De Jong et al. |
| 2009/0025753 A1 | 1/2009 | De Jong et al. |
| 2009/0027635 A1 | 1/2009 | De Jong et al. |
| 2009/0027636 A1 | 1/2009 | Leenders et al. |
| 2009/0086175 A1 | 4/2009 | Streefkerk et al. |
| 2009/0091716 A1 | 4/2009 | Kadijk et al. |
| 2009/0174870 A1 | 7/2009 | De Jong et al. |
| 2009/0174871 A1 | 7/2009 | De Jong et al. |
| 2009/0190105 A1 | 7/2009 | De Jong |
| 2009/0195761 A1 | 8/2009 | De Graaf et al. |
| 2009/0226849 A1* | 9/2009 | Tsukamoto et al. .......... 430/325 |
| 2010/0134772 A1 | 6/2010 | Nagasaka et al. |

FOREIGN PATENT DOCUMENTS

| | | | |
|---|---|---|---|
| EP | 0418427 | 3/1991 | |
| EP | 0 834 773 A2 | 4/1998 | |
| EP | 1 486 827 | 12/2004 | |
| JP | A 57-153433 | 9/1982 | |
| JP | 06-124873 | 5/1994 | |
| JP | A 06-168866 | 6/1994 | |
| JP | 07-132262 | 5/1995 | |
| JP | 07-220990 | 8/1995 | |
| JP | A10-154659 | 6/1998 | |
| JP | 10-255319 | 9/1998 | |
| JP | 10-303114 | 11/1998 | |
| JP | 10-340846 | 12/1998 | |
| JP | 11-162831 | 6/1999 | |
| JP | 11-283903 | 10/1999 | |
| JP | 2000-323396 | 11/2000 | |
| JP | 2001-121063 | 5/2001 | |
| JP | 2001-284224 | 10/2001 | |
| JP | 2002-236111 | 8/2002 | |
| JP | 2004-193252 | 7/2004 | |
| JP | 2004-207696 | 7/2004 | |
| JP | 2005-072404 | 3/2005 | |
| JP | 2005-079222 | 3/2005 | |
| JP | 2005236079 A * | 9/2005 | ............ H01L 21/027 |
| JP | 2005277363 A * | 10/2005 | ............ H01L 21/027 |
| JP | 2006-073951 | 3/2006 | |
| JP | 2006-134999 | 5/2006 | |
| JP | 2006-148093 | 6/2006 | |
| JP | 2006-165502 | 6/2006 | |
| JP | 2006-179909 | 7/2006 | |
| JP | 2006-310706 | 11/2006 | |
| JP | 2007-029973 | 2/2007 | |
| JP | 2007-088328 | 4/2007 | |
| JP | 2007-123882 | 5/2007 | |
| JP | 2007-142217 | 6/2007 | |
| JP | 2007-150102 | 6/2007 | |
| JP | 2007-227543 | 9/2007 | |
| JP | 2007-227580 | 9/2007 | |
| JP | 2009267200 A * | 11/2009 | |
| WO | WO 99/49504 | 9/1999 | |
| WO | WO 02/091078 A1 | 11/2002 | |
| WO | WO 2004/053596 A2 | 6/2004 | |
| WO | WO 2004/053950 A1 | 6/2004 | |
| WO | WO 2004/053952 A1 | 6/2004 | |
| WO | WO 2004/053955 A1 | 6/2004 | |
| WO | WO 2004/053958 A1 | 6/2004 | |
| WO | WO 2004/053959 A1 | 6/2004 | |
| WO | WO 2004/081666 A1 | 9/2004 | |
| WO | WO 2004/090577 | 10/2004 | |
| WO | WO 2004/093130 | 10/2004 | |
| WO | WO 2005/003864 A2 | 1/2005 | |
| WO | WO 2005/008339 A2 | 1/2005 | |
| WO | WO 2005/010611 | 2/2005 | |
| WO | WO 2005/019935 A2 | 3/2005 | |
| WO | WO 2005/024325 A2 | 3/2005 | |
| WO | WO 2005/050324 A2 | 6/2005 | |
| WO | WO 2005/054953 A2 | 6/2005 | |
| WO | WO 2005/062128 A2 | 7/2005 | |
| WO | WO 2005/081067 A1 | 9/2005 | |
| WO | WO 2005/122218 | 12/2005 | |
| WO | WO 2006/041086 | 4/2006 | |
| WO | WO 2006/062065 | 6/2006 | |
| WO | WO 2006/122578 | 11/2006 | |
| WO | 2007/005362 | 1/2007 | |
| WO | WO 2007/006447 | 1/2007 | |
| WO | WO 2007/135990 | 11/2007 | |
| WO | WO 2007/136089 A1 | 11/2007 | |
| WO | WO 2008/001871 | 1/2008 | |

OTHER PUBLICATIONS

English translation of JP2005-236079, published on Sep. 2, 2005.*
Chang, Ching Yu et al., "Development of Cleaning Process for Immersion Lithography," Optical Microlithography XIX, Proc. of SPIE vol. 6154 61544R, 2006, 11 pages.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).

(56) References Cited

OTHER PUBLICATIONS

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2µm Fine Patterns Using Optical Projection Lithography with an Oil Immersion Lens", Jpn. J. Appl. Phys. vol. 31 (1992), pp. 4174-4177.

G. Owen et al., "1/8µm Optical Lithography", J. Vac. Sci. Technol. B., vol. 10, No. 6, Nov./Dec. 1992, pp. 3032-3036.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Decision of Rejection for Japanese Patent Application No. 2005-364310, dated Mar. 24, 2009.

Information Disclosure Statement filed Feb. 8, 2007 for U.S. Appl. No. 11/703,802.

Office Action dated Jun. 29, 2007 issued for U.S. Appl. No. 11/703,802.

Emerging Lithographic Technologies VI, Proceedings of SPIE, vol. 4688 (2002), "Semiconductor Foundry, Lithography, and Partners", B.J. Lin, pp. 11-24.

Optical Microlithography XVI, Proceedings of SPIE vol. 5040 (2003), "Immersion lithography; its potential performance and issues", Soichi Owa et al., pp. 724-733.

Office Action for U.S. Appl. No. 11/222,319 dated Mar. 25, 2008.

English translation of Notice of Reasons for Rejection issued for Japanese Patent Application No. 2005-364310, dated Dec. 2, 2008.

Japanese Office Action mailed Oct. 5, 2010 in related Japanese patent application No. 2008-028305.

Japanese Office Action mailed Mar. 1, 2011 in corresponding Japanese application No. 2008-028305.

Chinese Office Action dated Jun. 11, 2012 in corresponding Chinese Patent Application No. 201110022569.4.

U.S. Notice of Allowance dated Oct. 8, 2013 in corresponding U.S. Appl. No. 11/706,434.

\* cited by examiner

SYSTEMS AND METHODS FOR INSITU LENS CLEANING USING OZONE IN IMMERSION LITHOGRAPHY

CROSS REFERENCE TO RELATED APPLICATIONS

This application is a continuation-in-part of U.S. patent application Ser. No. 11/706,434, entitled "Systems and Methods for Insitu Lens Cleaning in Immersion Lithography," filed Feb. 15, 2007, which is incorporate herein by reference in its entirety. This application claims priority from Japanese Patent Application No. 2008-28305, filed Feb. 8, 2008, the subject matter of which is incorporated herein by reference.

BACKGROUND

1. Field of the Invention

The present invention relates to immersion lithography, more particularly, to providing methods for insitu lens cleaning in immersion lithography systems.

2. Related Art

Lithography is a process used to create features on the surface of substrates. Such substrates can include those used in the manufacture of flat panel displays (e.g., liquid crystal displays), semiconductor wafers, circuit boards, various integrated circuits, print heads, macro/nano-fluidic substrates, and the like. During lithography, a substrate, which is disposed on a substrate stage, is exposed to an image projected onto the surface of the substrate by exposure optics located within a lithography apparatus.

The projected image produces changes in the characteristics of a layer, for example, photoresist, deposited on the surface of the substrate. These changes correspond to the features projected onto the substrate during exposure. Subsequent to exposure, the layer can be etched or otherwise processed to produce a patterned layer. The pattern corresponds to those features projected onto the substrate during exposure. The patterned layer is then used to remove or further process exposed portions of underlying structural layers within the substrate, such as conductive, semiconductive, or insulative layers. This process is repeated, together with other steps, until the desired features have been formed on the surface, or in various layers, of the substrate.

In the field of immersion lithography the exposure operation is conducted with an immersion liquid, which typically has been water, between the last lens element of the projection optics and the substrate. The surface of the final lens element is manually cleaned periodically using solvents. The residues that are removed are generally from processing associated with resist leaching from the ultra-violet exposure of photoresist on substrates being processed. This approach to lens cleaning is time consuming, as the lens must typically be removed. Moreover, the approach is not well suited for new immersion lithography exposure systems. New immersion lithography systems use high refractive index immersion fluids. The high refractive index immersion fluids are organic and breakdown under ultraviolet exposure to produce carbonaceous deposits, which are not easily manually cleaned from the surface of lens.

What are needed are methods for insitu cleaning of lens used in immersion lithography systems operated with high refractive index immersion fluids.

SUMMARY

The present invention is directed to immersion lithography apparatus that includes an energy source, a projection optical system, a stage that moves a substrate on which the substrate is place, a showerhead including an immersion liquid supply device and an immersion liquid discharge device that produces a flow of liquid between the projection optical system and the substrate and a cleaning device that cleans a portion of the projection optical system having been contacted with the immersion liquid by means of a cleaning gas. In an embodiment, the cleaning device includes a gas supply device and a gas discharge device. The gas supply device produces a flow of cleaning gas between the final lens element of the projection optical system and the stage. The final lens element comes in contact with the immersion fluid, and may also be referred to as the wet lens element. In embodiments, the apparatus includes a wafer stage that includes a dose sensor to determine when cleaning of a final lens element is needed. The wafer stage can also include an ultra-violet light source or one or more mirrors used to reflect ultra-violet light onto the surface of a final lens element that is being cleaned. In an embodiment, the energy source of the system provides the ultra-violet light for cleaning.

The invention also provides a method for insitu cleaning of a final lens element within an immersion lithography system having an immersion fluid showerhead that provides immersion fluid to an exposure zone of the immersion lithography system. The method includes determining that the final lens element requires cleaning. Once this determination is made, the immersion fluid is drained from the showerhead and exposure zone. A cleaning gas is then passed through the showerhead across the final lens element surface exposed to the immersion fluid. Alternatively the gas can be passed through means other than the showerhead. While the final lens element is exposed to the cleaning gas, the final lens element is also exposed to ultra-violet light. In the presence of the ultra-violet light, the cleaning gas reacts with contaminants on the surface of the wet lens to remove the contaminants/debris from the lens. The debris that is vaporized by the reaction is swept away by the flowing cleaning gas, thereby cleaning the final lens element.

In another embodiment, ozone is generated within a gas delivery system. In such an embodiment, a cleaning gas mixture that includes ozone and other gases, such as oxygen and nitrogen is generated in a gas delivery system. The gas mixture in then delivered to the wet lens element for cleaning. In this embodiment an ultra-violet light source is not needed.

The invention provides an efficient system and method for insitu cleaning of final lens element that does not damage the final lens element, nor does it require the painstaking task of lens removal and repositioning.

BRIEF DESCRIPTION OF THE DRAWINGS

The present invention is described with reference to the accompanying drawings. In the drawings, like reference numbers indicate identical or functionally similar elements. The drawing in which an element first appears is indicated by the left-most digit in the corresponding reference number.

DETAILED DESCRIPTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Figure 1:
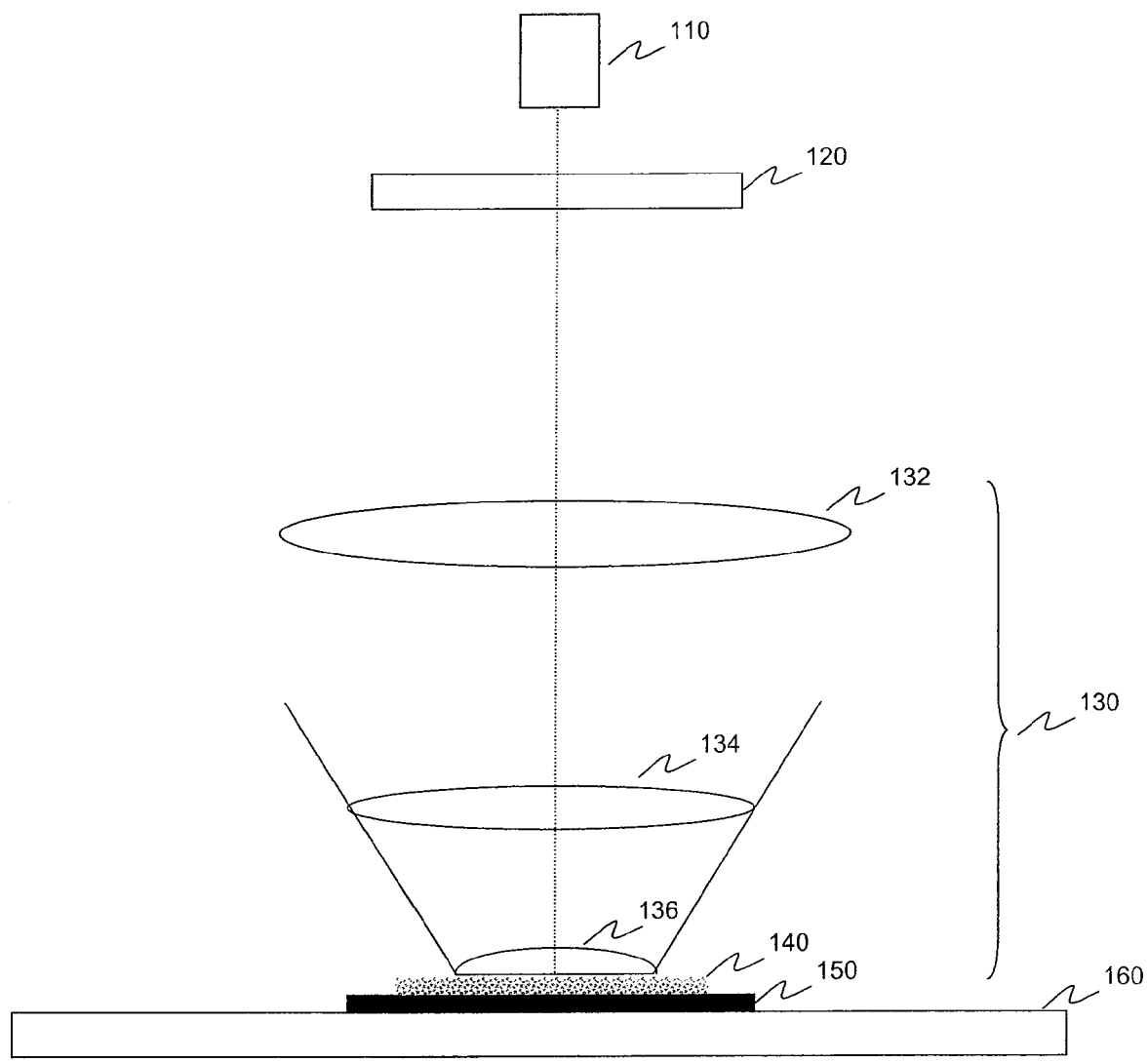
FIG. 1 is a block diagram of an immersion lithography system.

In immersion lithography systems, liquid is injected into the space between a projection optical system exit window and a substrate surface that is being worked. FIG. 1 is a block diagram of immersion lithography system 100. System 100 includes energy source 110, pattern generator 120, and projection optical system 130. Energy source 110 produces exposure doses of energy that are used to pattern a substrate, such as substrate 150, that is being worked. Pattern generator 120 generates the pattern to be produced on substrate 150.

Projection optical system 130 includes optical element 132, optical element 134 and optical element 136, which is also referred to as an exit POS element or a final lens element. Projection optical system 130 conditions the energy provided by energy source 110 to properly focus it onto substrate 150 to produce the desired pattern.

Substrate 150 is secured to the surface of wafer stage 160. Wafer stage 160 is mechanically coupled to a lithography machine and moves to adjust the position of the substrate underneath the projection optics depending on the area of the substrate being patterned. As individuals skilled in the art will know, projection optical systems may have a wide range of optical elements, both in number and type. Projection optical system 130 provides a simplified example for illustration purposes and is not intended to limit the scope of the invention.

Immersion liquid 140 fills the space between substrate 150 and final lens element 136, referred to as the exposure zone. An immersion lithography showerhead (not shown) provides for the flow of immersion liquid 140 across the area of the substrate being worked. Over time deposits resulting from the ultra-violet exposure process and impurities in the immersion liquid form on the surface of final lens element 136. These deposits impair the performance of the immersion lithography apparatus and need to be periodically cleaned.

Cleaning the lens surface of lens element 136 proposes significant challenges. For example, the cleaning process should not damage the lens.

Unfortunately, many cleaning solutions are corrosive to the materials used in lens elements and will roughen the lens surface. Also, since the lens element is embedded within the tool, the cleaning temperature must not become too high. Given these limitations, significant care is taken to keep the lens clean, such as adjusting the distance between the last lens element and keeping a high flow rate of immersion fluid to keep debris from settling on the lens surface. Additionally, purification of the immersion fluid occurs to keep ultra-violet transmission high. While these steps can reduce debris and ultra-violet activated deposition, they do not eliminate it. Thus, often the lens element must be accessed or removed for cleaning, which is also undesirable because of the time it takes to remove and replace the lens, and the increased probability of damage to the lens during the removal process.

In a recent study, hydrogen peroxide and ozone were tested to see if the combination could oxidize organic contaminants. The study concluded that the oxidant was too weak to remove the contamination. The study also noted that different kinds of surfactant including ionic and anionic were also tried, but with no clear improvement. See Chang, et. al., Development of Cleaning Process for Immersion Lithography, Proc. of SPIE, Vol. 6154 (2006) ("Chang Study").

U.S. patent application Ser. No. 11/217,464, entitled *Liquid Immersion Optical Tool Method for Cleaning Liquid Immersion Optical Tool, and Method for Manufacturing Semiconductor Device*, filed by Higashiki on Sep. 2, 2005 ("Higashiki Patent Application") describes an apparatus for cleaning a final lens element using a cleaning solution. The cleaning solution is passed across the final lens element to clean debris from the lens. Function water such as ozone water, ionized water, carbonated water, or peroxide water is used as the cleaning solution. Alternatively, acid is used as a cleaning solution. In addition, cleaning may be carried out using water vapor.

Higashiki Patent Application at ¶39. An ultrasound wave, a water jet or a cavitation jet can be used to generate cavities in the cleaning solution to provide for a scrubbing action as the solution is passed through the area to be cleaned. Specialized nozzles are used. Id. at ¶40-41. The cleaning solution is evacuated once the cleaning process has ended through a rinse process. Id. at ¶48.

In contrast to the above system described in the Higashiki Patent Application and the results of the Chang Study, the present invention addresses cleaning of a final lens element, such as lens 136, by using an ultra-violet activated oxygen based gaseous cleaning process to periodically remove absorbed deposits on the wet lens surface of lens 136. Rather than use a cleaning solution, as is the case in the Higashiki Patent Application, the present invention uses an oxygen-based gas that is activated by ultra-violet light to provide the cleaning action.

Figure 2:
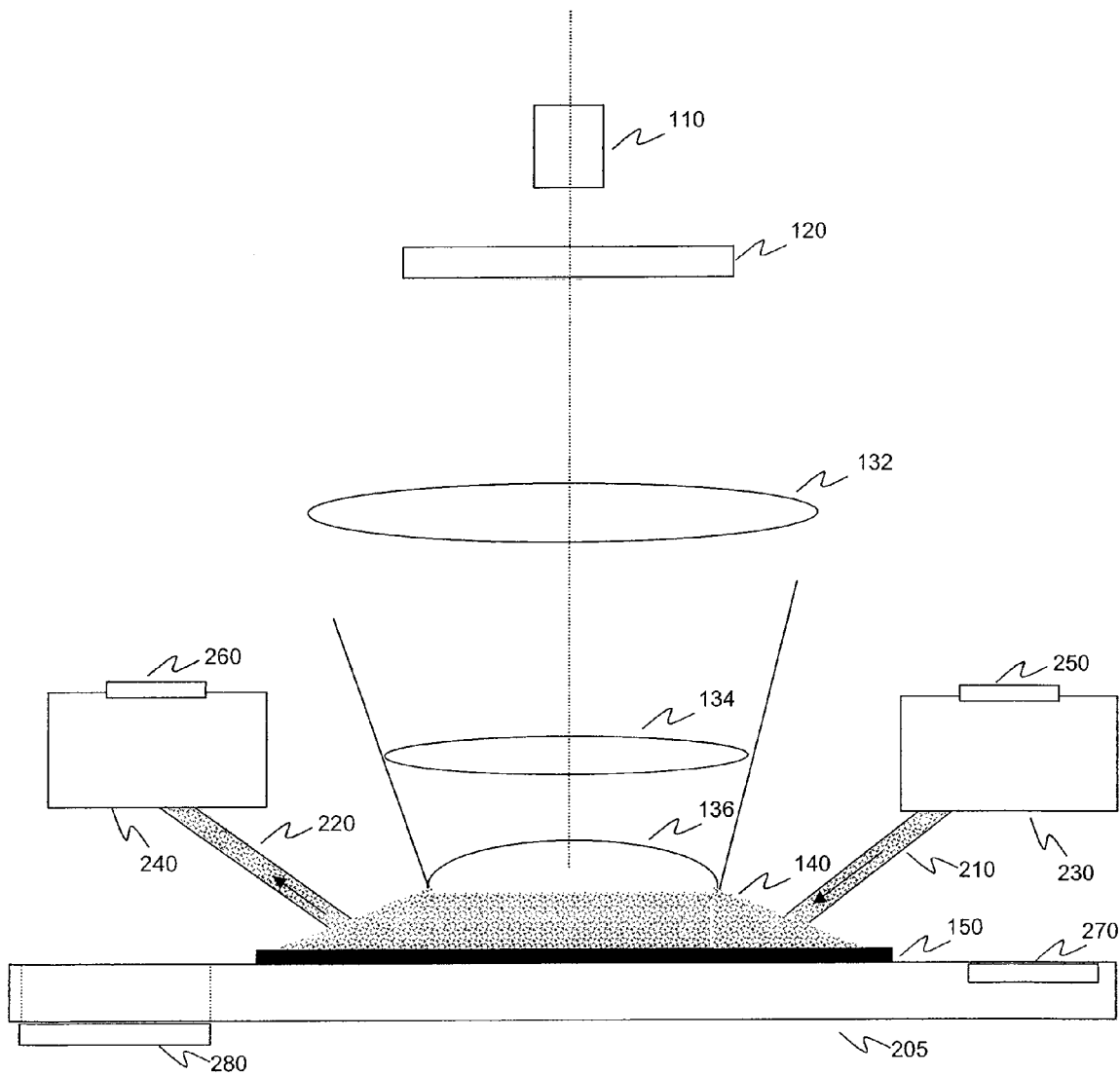
FIG. 2 is a block diagram of an immersion lithography system, according to an embodiment of the invention.
Figure 3:
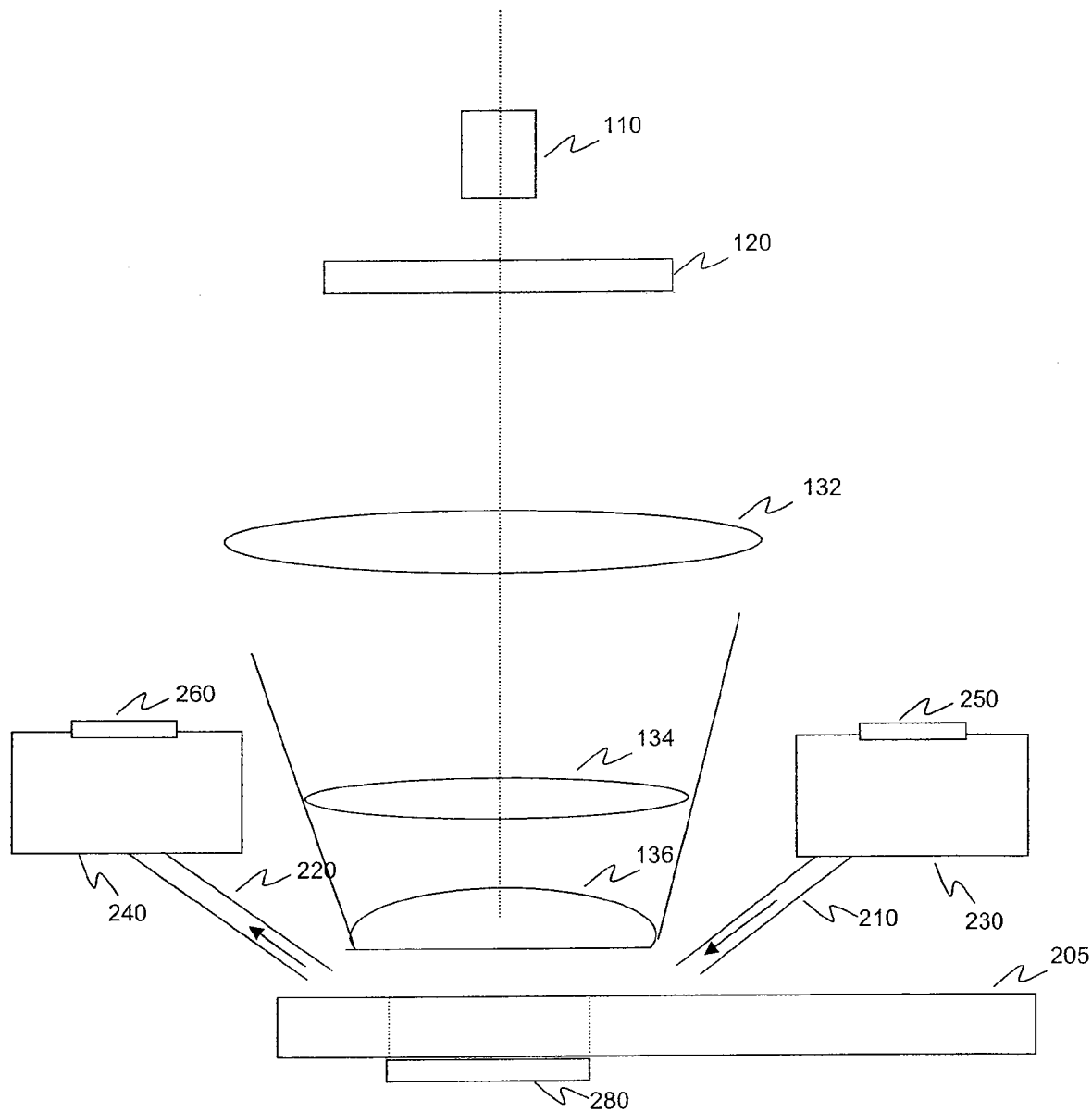
FIG. 3 is a block diagram of an immersion lithography system with an ultra-violet light source positioned for final lens element cleaning, according to an embodiment of the invention.

FIG. 2 provides a diagram of immersion lithography apparatus 200, according to an embodiment of the invention. As in the case of immersion lithography apparatus 100, immersion lithography apparatus 200 includes an energy source 110, pattern generator 120, and projection optical system 130.

Energy source 110 produces exposure doses of energy that are used to pattern a substrate, such as substrate 150 that is being worked. Pattern generator 120 generates the pattern to be produced on substrate 150.

Immersion lithography apparatus 200 also includes an immersion liquid supply device 230 and an immersion liquid discharge device 240 that produces a flow of liquid 140 between the final lens element 136 and substrate 150. Immersion liquid 140 flows through supply tube 210, across the area between final lens element 136 and substrate 150, referred to as the exposure zone, and exits through discharge tube 220 into immersion liquid discharge device 240. Immersion liquid supply device 230, immersion liquid discharge device 240, supply tube 210 and discharge tube 220 are intended to depict the primary elements of a showerhead. The invention is not limited to use with a showerhead, as described, but rather individuals skilled in the art will be able to able the invention to other types of showerhead designs based on the teachings herein. In an embodiment, either or both of immersion liquid supply device 230 and immersion liquid discharge device 240 include a vent or other means for evacuating the immersion liquid entirely in preparation for when the cleaning process takes place.

Immersion lithography apparatus 200 also includes a cleaning device that cleans a portion of the projection optical system. The cleaning device includes gas supply device 250 and gas discharge device 260. The gas supply device 250 produces a flow of cleaning gas between the final lens element 136 and stage 160. In the present embodiment, gas supply device 250 is a vent upon which a gas supply tube (not shown) can be affixed. Likewise gas discharge device 260 is a vent upon which a gas discharge tube (not shown) can be affixed to remove cleaning gas. Gas supply device 250 and gas discharge device 260 can include any type of device or apparatus that can produce a flow of gas. The cleaning gas can include air, oxygen enhanced air or oxygenated noble gases, for example.

In an alternative embodiment, or an embodiment with an additional feature, gas supply device 250 is coupled to an ozone generation system, such as AE13MC Concentration Unit manufactured by Absolute Systems, Inc. Gas supply device 250 then forces the cleaning gas across the final lens element 136. In this embodiment, an ultra-violet light source is not necessary for cleaning purposes. In another embodiment, electric discharge can be used to generate ozone. One or both of the gas supply device 250 and the gas discharge device 260 are comprised within the showerhead. One or both of the gas supply device 250 and the gas discharge device 260 may be affixed to the showerhead.

Substrate 150 is secured to the surface of wafer stage 205. Wafer stage 205 is mechanically coupled to a lithography machine and moves to adjust the position of the substrate underneath the projection optics depending on the area of the substrate being patterned. In other embodiments, wafer stage 205 can be replaced by wafer stage 160 or wafer stage 405, as discussed below.

Additionally, in an embodiment wafer stage 205 includes dose sensor 270 and ultra-violet light source 280. Dose sensor 270 can be positioned under final lens element 136 to determine whether cleaning of the lens is needed. Dose sensor 270 senses the received energy transmitted through projection optics 130. When the sensed energy is below a certain threshold, or uniformity across the exposure zone is degraded below an acceptable level, a lens cleaning indication is provided. The threshold varies by the type of energy source 110, the energy dose, the projection optical system 130 and the type of immersion fluid being used.

Ultra-violet light source 280 generates ultra-violet light that is used to illuminate portions of final lens element 136 during the cleaning process. When the cleaning process has begun, wafer stage 160 is positioned such that ultra-violet light source 280 is positioned underneath the area being cleaned. Note that wafer stage 160 includes an opening with a clear surface that permits the ultra-violet light to impinge upon final lens element 136. In an embodiment, energy source 110 can provide the ultra-violet light needed to support cleaning.

Figure 4:
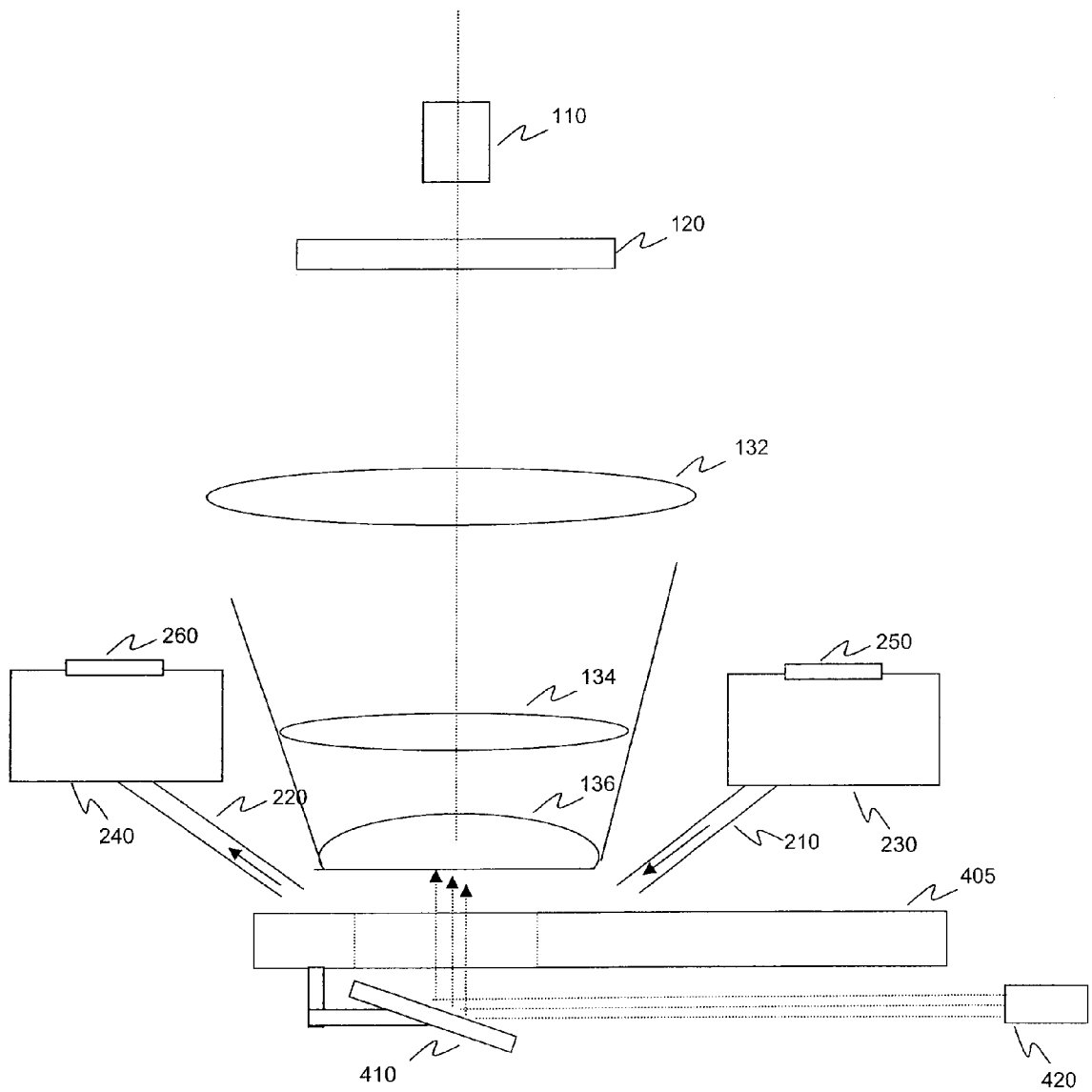
FIG. 4 is a block diagram of an immersion lithography system with a mirror positioned to reflect ultra-violet light for final lens element cleaning, according to an embodiment of the invention.

Referring to FIG. 4, wafer stage 405 can also be used in embodiments of immersion lithography apparatus 200 as an alternative to wafer stage 205.

When wafer stage 405 is used, an ultra-violet light source 420 transmits ultra-violet light to mirror 410, which is mounted on the bottom of wafer stage 405. Mirror 410 directs the ultra-violet light to impinge on the optical element being cleaned, typically final lens element 126.

Figure 5:
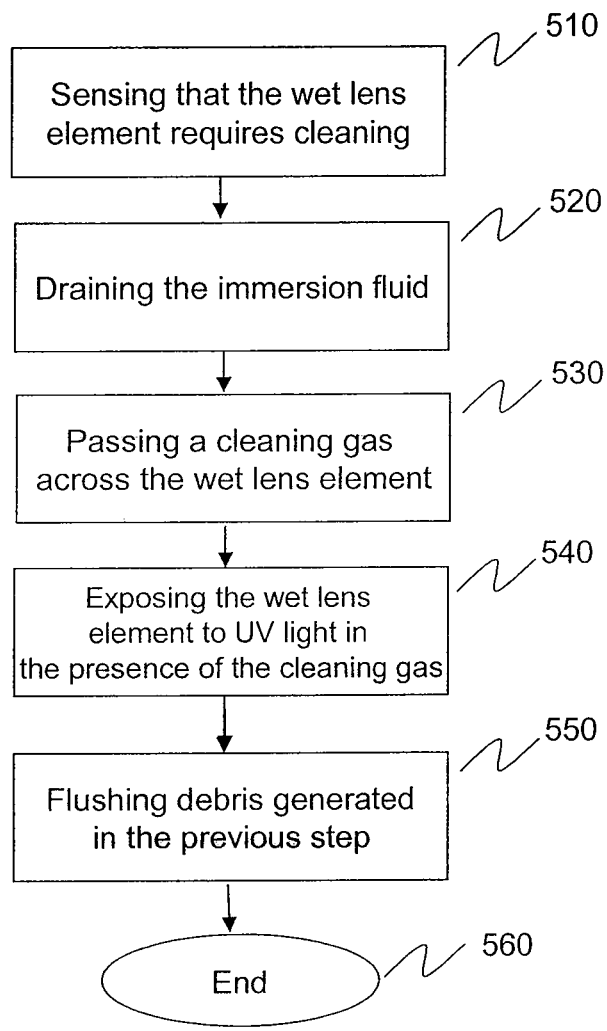
FIG. 5 is a flowchart of a method for compensating for a heating effect of exposure energy in an immersion fluid across an exposure zone of an immersion lithography system using pre-calibrated aberration information, according to an embodiment of the present invention.

FIG. 5 provides a flowchart of method 500 for insitu cleaning of a final lens element within an immersion lithography system, according to an embodiment of the invention. Method 500 begins in step 510. In step 510, an indication that a final lens element requires cleaning is determined. As was discussed above, carbonaceous deposits build up on the surface of final lens elements. In one embodiment, a dose sensor, such as dose sensor 270, can be used to determine whether a final lens element, such as final lens element 136 requires cleaning. Alternatively, based on the type of immersion fluid and the fluid handler cleaning a determination can be made whether it is time to clean the final lens element.

In step 520 immersion fluid is drained. For example, immersion fluid 140 can be drained from immersion liquid supply device 230 and immersion liquid discharge device 240. In an embodiment, immersion liquid discharge device includes a vent or other means for evacuating the immersion liquid entirely in preparation for the cleaning process.

In step 530 a cleaning gas is passed across the final lens element. In embodiments, the cleaning gas can include air, oxygen enhanced air, or oxygenated noble gases. Cleaning gas supply device 250 forces the cleaning gas into the area between final lens element 135 and wafer stage 205, for example. Cleaning gas discharge device 240 receives gas being forced across final lens element 135. In an embodiment, gas discharge device 240 can include a vacuum to extract the cleaning gas. External gas pumps and vacuums can be attached to gas supply device 230 and gas discharge device 240. In an embodiment, gas supply device 230 and gas discharge devices 240 are vents that are coupled to external supply and discharge apparatus. Prior to exposing the final lens element to ultra-violet light during the cleaning process, the final lens element should be dried. In an embodiment, step 530 occurs sufficiently long enough to ensure that the surface of the final lens element is dried. In an alternative embodiment a separate drying gas is passed across the final lens element following step 520 and before the introduction of the cleaning gas in step 530. The drying gas is passed across the final lens element for a sufficiently long enough period to time to ensure that the surface of the final lens element to be cleaned is dried. The drying may take between a few seconds to a few hours. It is desirable that the duration is as short as possible, preferably without incurring damage to the lens and/or surrounding features which may be sensitive to the drying process.

In step 540 the final lens element that has been dried is exposed to ultra-violet light in the presence of the cleaning gas that is being passed across the final lens element. The duration of steps 530 and 540 can range from a few seconds to hours based on the thickness of debris that has accumulated on the final lens element. The action of the ultra-violet light on the oxygen in the cleaning gas produces ozone, which removes the organic/carbonaceous deposits formed a final lens element surface. During step 540 the debris is vaporized by the ozone or other cleaning gas to produce $CO_2$ and water vapor. The ultra-violet light can either be generated by energy source 110, by ultra-violet light source 280 or by ultra-violet light source 420.

In another embodiment with alternative or additional features, ozone is generated by a gas delivery system. An example ozone generation system is, for example, AE13MC Concentration Unit manufactured by Absolute Systems, Inc. The gas delivery system creates a cleaning gas mixture, which is typically a combination of oxygen, nitrogen and ozone. The cleaning gas mixture is determined based on the carbonaceous deposit removal rate and safety.

In an embodiment, the ozone concentrations are as high as is possible, as the ozone is the active etchant. Typically the concentration of ozone is selected so that the ozone is effective in cleaning the final lens element, but would not damage other features surrounding the lens which may be sensitive to ozone. The cleaning gas is passed across the final lens element surface to be cleaned, passage of the cleaning gas removes the organic/carbonaceous deposits. Thus the duration the cleaning gas flows over the final lens element so it may come into contact with the lens is sufficient to remove the contaminating deposits. The duration is limited so to damage does not occur to surrounding features which may be damaged by the ozone. The duration of the cleaning using the cleaning gas may depend on features sensitive to the cleaning gas. The duration may depend on the thickness of deposits which may have accumulated on the final lens element. The duration may last from a few second sot a few hours. Desirably, the duration is as short as possible.

In this embodiment, an ultra-violet light source may not be necessary, as the ozone is produced with the gas delivery system.

In step 550 debris, which was vaporized in the previous step, is flushed away by the flowing cleaning gas. In step 560, method 500 ends. Following the cleaning process, immersion liquid is reintroduced into immersion liquid supply device 230 and immersion liquid discharge device 240.

Conclusion

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. An immersion lithography apparatus, comprising:
   an energy source;
   a projection optical system;
   a stage that moves a substrate on which the substrate is placed;
   a showerhead including an immersion liquid supply device and an immersion liquid discharge device that produces a flow of an immersion liquid between the projection optical system and the substrate; and
   a cleaning device that cleans a portion of the projection optical system having been contacted with the immersion liquid by means of a cleaning gas and without irradiating UV radiation on the portion of the projection optical system during application of the cleaning gas, wherein the cleaning device includes a gas supply device on one side of the portion of the projection optical system and a gas discharge device on another side of the portion of the projection optical system such that the gas supply device produces a gas flow comprising ozone across the portion of the projection optical system from the one side to the other side.

2. The immersion lithography apparatus of claim 1, wherein the gas supply device and gas discharge device are affixed to the showerhead.

3. The immersion lithography apparatus of claim 1, wherein the gas supply device includes a gas supply vent located on the liquid immersion supply device and a gas discharge vent located on the liquid immersion discharge device.

4. The immersion lithography apparatus of claim 1 further comprising a dose sensor that senses the energy level transmitted through a final lens element to determine whether cleaning of the final lens element is necessary.

5. A method for in situ cleaning of a final lens element within an immersion lithography system having an immersion fluid showerhead that provides an immersion fluid to an exposure zone of the immersion lithography system, comprising:
   (a) draining the immersion fluid from the showerhead and exposure zone;
   (b) drying the final lens element;
   (c) providing a gas comprising ozone from one side of a final lens element surface and receiving the gas at another side of the final lens element surface, thereby producing a gas flow through the showerhead across the final lens element surface exposed to the immersion fluid from the one side to the other side, wherein the gas flow produces debris from contaminants removed from the final lens element, wherein the debris is produced without irradiating UV radiation on the final lens element surface; and
   (d) flushing the debris generated in step (c) away from the final lens element.

6. The method of 5, wherein the duration of steps (b) and (c) range from a few seconds to hours based on the thickness of debris that has accumulated on the final lens element.

7. The method of 5, further comprising sensing an energy dose level transmitted through the final lens element to determine whether cleaning of final lens element is necessary.

* * * * *